(12) United States Patent
Swain et al.

(10) Patent No.: US 7,808,849 B2
(45) Date of Patent: Oct. 5, 2010

(54) READ LEVELING OF MEMORY UNITS DESIGNED TO RECEIVE ACCESS REQUESTS IN A SEQUENTIAL CHAINED TOPOLOGY

(75) Inventors: Jyotirmaya Swain, Bangalore (IN); Edward L Riegelsberger, Fremont, CA (US); Utpal Barman, Bangalore (IN)

(73) Assignee: NVIDIA Corporation, Santa Clara, CA (US)

( * ) Notice: Subject to any disclaimer, the term of this patent is extended or adjusted under 35 U.S.C. 154(b) by 110 days.

(21) Appl. No.: 12/168,948

(22) Filed: Jul. 8, 2008

(65) Prior Publication Data

US 2010/0008158 A1    Jan. 14, 2010

(51) Int. Cl.
*G11C 29/00* (2006.01)
*G11C 7/06* (2006.01)

(52) U.S. Cl. .................. 365/201; 365/189.07; 714/718; 714/719

(58) Field of Classification Search .................. 365/201
See application file for complete search history.

(56) References Cited

U.S. PATENT DOCUMENTS

| | | | |
|---|---|---|---|
| 5,023,776 A | 6/1991 | Gregor | |
| 5,640,366 A | 6/1997 | Majos et al. | |
| 5,809,514 A | 9/1998 | Nasserbakht et al. | |
| 6,006,339 A | 12/1999 | McClure | |
| 6,167,528 A * | 12/2000 | Arcoleo | 713/501 |
| 6,370,067 B1 * | 4/2002 | Ko et al. | 365/194 |
| 6,480,946 B1 * | 11/2002 | Tomishima et al. | 711/167 |
| 6,516,635 B1 | 2/2003 | Yang et al. | |
| 6,603,694 B1 * | 8/2003 | Frankowsky et al. | 365/222 |
| 6,615,345 B1 * | 9/2003 | LaBerge | 713/100 |
| 6,665,231 B2 | 12/2003 | Mizuno et al. | |
| 6,738,918 B2 * | 5/2004 | Toda | 713/400 |
| 7,343,533 B2 * | 3/2008 | Lee et al. | 714/718 |
| 7,385,861 B1 * | 6/2008 | Zhu | 365/194 |
| 7,392,465 B2 | 6/2008 | Azimane et al. | |
| 2002/0040454 A1 * | 4/2002 | Raad et al. | 714/719 |
| 2002/0184461 A1 * | 12/2002 | Zumkehr | 711/167 |
| 2004/0104749 A1 | 6/2004 | Yeh | |
| 2005/0135167 A1 | 6/2005 | Manabe | |
| 2005/0182993 A1 * | 8/2005 | Okawa et al. | 714/718 |
| 2006/0041799 A1 * | 2/2006 | Sato | 714/718 |
| 2006/0256205 A1 | 11/2006 | Kim et al. | |
| 2007/0008791 A1 * | 1/2007 | Butt et al. | 365/193 |
| 2008/0238516 A1 | 10/2008 | Iorga | |

OTHER PUBLICATIONS

"JEDEC Standard", "DDR3 SDRAM Specification", Date: Sep. 2007, pp. 1-189.

* cited by examiner

*Primary Examiner*—Son L Mai

(57) ABSTRACT

Read leveling of memory units designed to receive access requests in a sequential chained topology writing a data pattern to the memory array. In an embodiment, a memory controller first writes a desired pattern into the memory array of a memory unit and then iteratively determines the accurate calibrated delay by setting a compensation delay to a test value, reading a data portion from the memory array based on the test value for the compensation delay, comparing the data portion with an expected data, determining that the test value is a calibrated compensation delay for the memory unit if the data portion equals the expected value.

26 Claims, 5 Drawing Sheets

READ LEVELING OF MEMORY UNITS DESIGNED TO RECEIVE ACCESS REQUESTS IN A SEQUENTIAL CHAINED TOPOLOGY

BACKGROUND

1. Field of Disclosure

The present invention relates to the design of memory systems and more specifically to read leveling of the memory units designed to receive access requests in a sequential chained topology.

2. Related Art

There are several memory systems in which memory units are designed to receive access (read/write) requests in a sequential chained topology. In such systems, a memory controller typically sends control and address information on a single path, which passes the information to each of the memory units sequentially in the same order as in which the memory units are chained. DDR3 (double data rate three) technology based systems are examples of such memory systems, with DRAMs often being used as memory units, as is well known in the relevant arts.

A read leveling operation is often performed prior to reading data from the memory units. A read leveling operation generally determines the accurate value to be used for a compensation delay when read operations are performed later to retrieve corresponding data elements of interest from a memory unit. The compensation delay generally refers to a delay which would be employed by the memory controller in receiving (looking for) a data unit from a memory unit after sending a read request on the chained path. Such compensation delays need to be employed at least since there are various delays in a read request reaching a memory unit and for the retrieved data unit to reach the memory controller as well.

Read leveling needs to be performed for each of the memory units since the accurate values for corresponding compensation delay are different for different memory units. As an illustration, assuming that the propagation delay equals X time units between each successive pair of memory units, that there are N memory units, and that the first memory unit receives a command at time instance t0, successive memory units would receive the same command at (t0, t0+X, t0+2X, ... t0+(n−1)X). These propagation delays are often referred to as fly-by delays at least in relation to DDR3 technology.

Thus, read leveling operation may need to determine the correct value to be used for a compensation delay while reading data elements for each memory unit to counter the fly-by delays (between the memory units as well as to the first memory unit) and address any other timing/delay parameters as relevant to the corresponding environment.

Several errors may be encountered in the absence of read leveling. For example, in a high speed memory system requiring data portions received from different memory units to be assembled as a word, substantial propagation delays can lead to incorrect data portions (e.g., one data portion received from one memory unit in response to one clock edge and another data portion received in response to a different clock edge) being matched/aligned and provided as a corresponding word. In addition, noise or other incorrect signals may be erroneously interpreted as data.

Once the read leveling is performed with a desired level of accuracy, one or more of such problems can be avoided during read operations.

DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides for read leveling of memory units designed to receive access requests in a sequential chained topology by writing a data pattern to the memory array. In an embodiment, a memory controller first writes a desired pattern into the memory array of a memory unit and then iteratively determines the accurate value for the compensation delay to be used for a memory unit by setting the compensation delay to a test value, reading a data portion from the memory array based on the test value for the compensation delay, comparing the data portion with an expected data, determining that the test value is an accurate/calibrated compensation delay for the memory unit if the data portion equals the expected value.

In an embodiment, each of the memory units is implemented as a DRAM consistent with DDR3 technology and read leveling is performed for each of the memory units to determine the respective accurate values for the compensation delay to be employed during read operations Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Memory System

Figure 1:
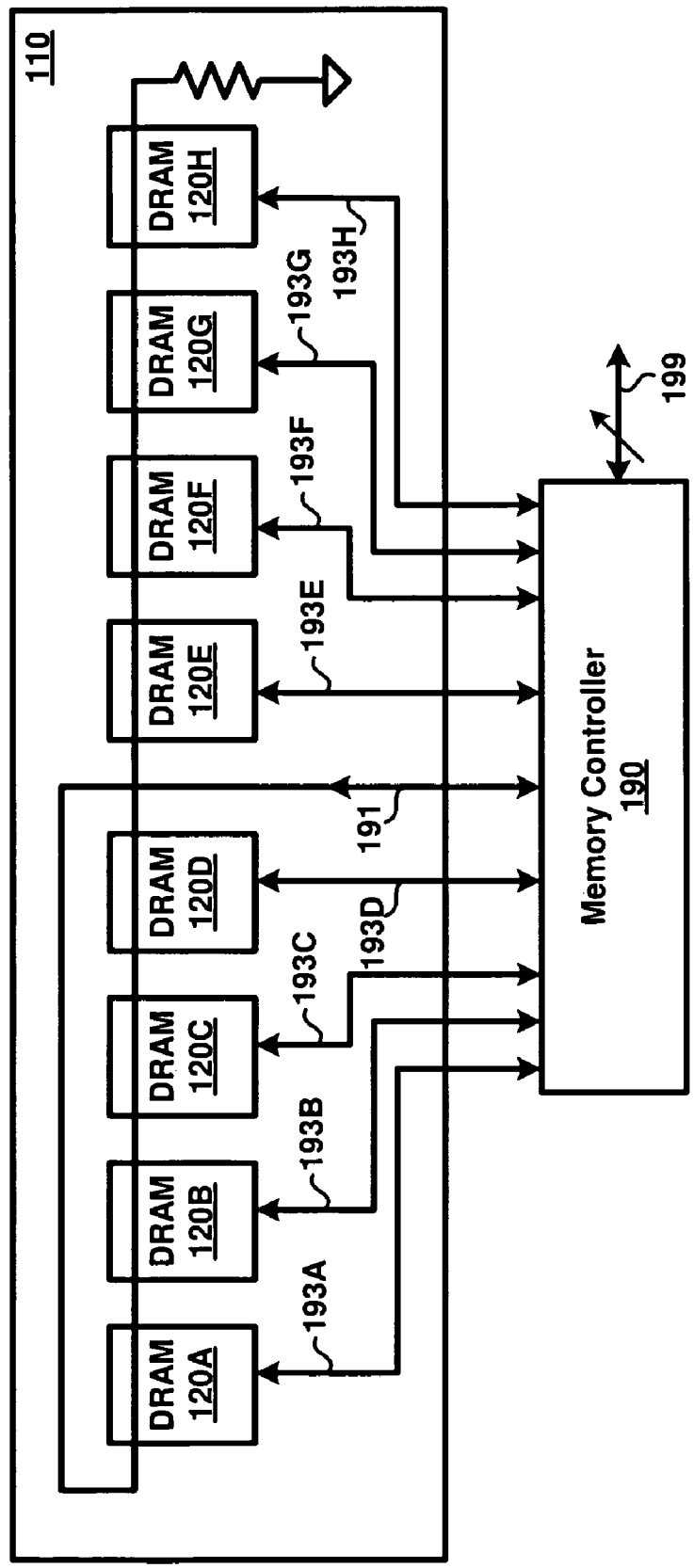
FIG. 1 is a block diagram of an example memory system in which several aspects of the present invention can be implemented.

FIG. 1 is a block diagram illustrating the details of an example memory system in which several aspects of the present invention can be implemented. For illustration, it is assumed that the memory system is based on DDR3 technology described in further detail in a document entitled, "DDR3

SDRAM Specification, Revision: JESD79-3A" dated September 2007 from JEDEC SOLID STATE TECHNOLOGY ASSOCIATION. However, the features can be implemented in other types of memory systems employing sequential chained topology to receive access requests.

The memory system is shown containing memory controller 190 and dual-in-line memory module (DIMM) 110. DIMM 110 in turn is shown containing memory units 120A-120H. Each block is described below in further detail.

Memory controller 190 sends control and address signals/information on chain path 191. The control signals sent on chain path 191 may include a clock signal, operation type (example read, write or instructions to start various types of calibration, etc.). The address specifies the specific (same) address in each of the memory units from which the data portion is to be accessed. The location of each DRAM along chain path 191 defines a sequential order, with DRAM 120A in the first position and DRAM 120H in the last position. Each DRAM receives the control/address information in the same order (with corresponding propagation delay) as the sequential order defined by the connections to chain path 191.

Each memory unit 120A-120H performs the specific operation specified by the operation type in response to receiving the control signals on chain path 191. The data portion DQ (for example, 8 bit byte in an embodiment consistent with DDR3 technology) along with DQS (DQ strobe) signal is present on each of paths 193A-193H for DRAMs 120A-120H respectively for read/write commands. In case of write operation, the data DQ is provided and DQS asserted by memory controller 190.

In case of read operation, DQ and DQS are provided/asserted by the corresponding memory unit. Thus eight bytes may be successively received from each of the eight memory units on each of eight successive clock edges in response to a read request sent on path 191. Eight bytes thus received from different memory units on a specific clock edge (but delayed by corresponding calibrated delay) of the clock signal, may be viewed as a word. Considering burst length of eight in DDR3 technology, 64 bytes (in the form of 8 words, each received in response to a single clock edge) received in response to a single read request together are termed as cache line. As noted above, each byte of a word may be received with a corresponding time delay (skew), as illustrated with respect to FIG. 2.

3. Timing Diagram

Figure 2:
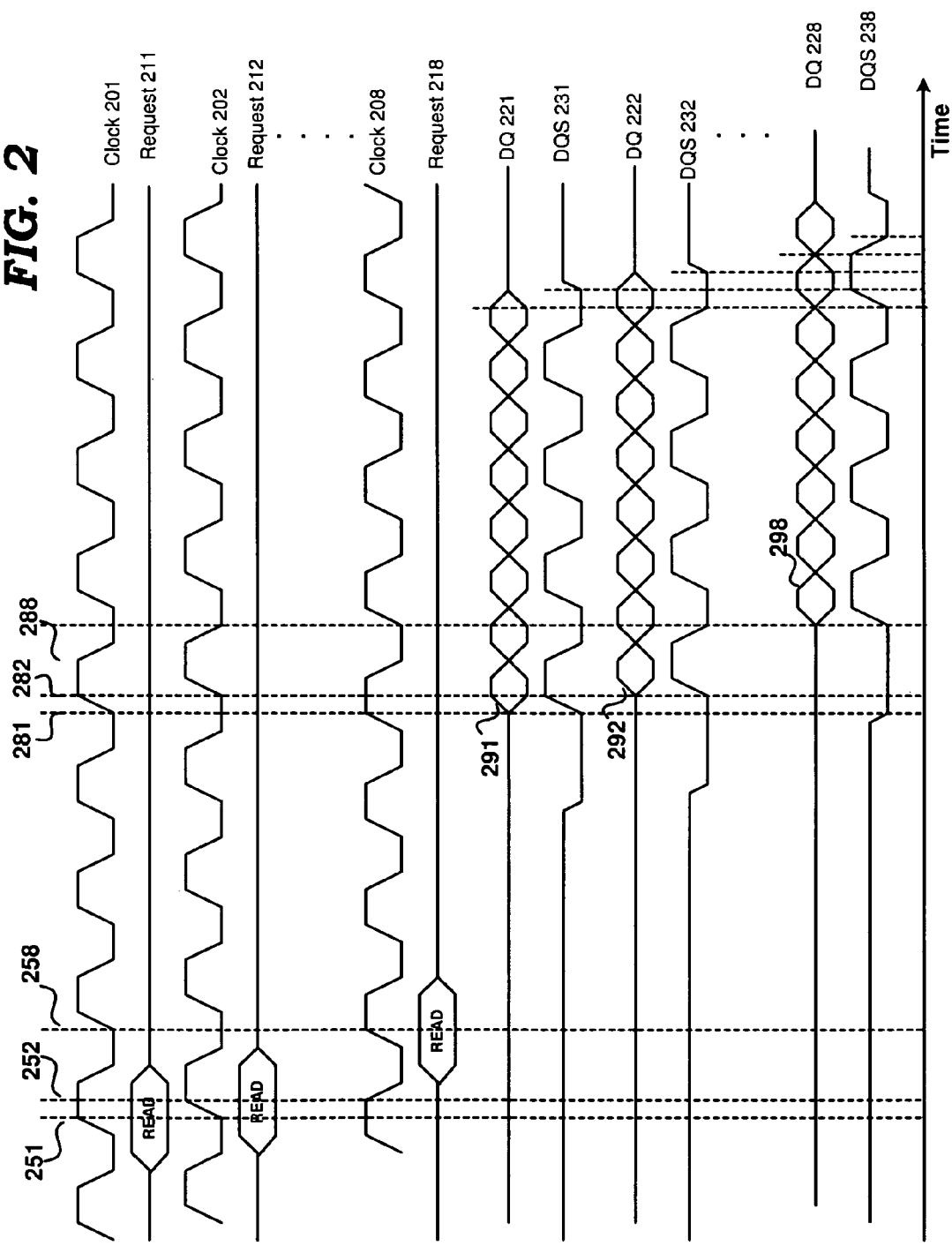
FIG. 2 is a timing diagram illustrating the need for read leveling in an embodiment.

FIG. 2 is a timing diagram illustrating the timing relationship of various signals in an example scenario of a read operation. The clock signals received by DRAMs 120A-120H are respectively represented as 201-208 and the same read command received at the memory units is shown as the corresponding signal on paths 211-218 (though only some of the signals are shown for conciseness). As may be observed, the read request is received at different time instances 251-258 on paths 211-218 (assuming each path is coupled to the corresponding memory unit 120A-120H) respectively, illustrating the propagation delay between receipt of time signals at the respective memory unit.

The DQ (DRAM-data) signals 221-228 indicate the time instances at which the respective bytes are received at memory controller 190. Bytes 291-298 received respectively from DRAMs 120A-120H together form a single word. Eight such words forming a cache line are shown received. The edges of DQS signals 231-238 (at respective time instances 281-288) indicate the boundaries of respective time durations (on logic high) in which DQ data is available for capturing.

It should be appreciated that the beginning of availability of data (at time instances 281-288 for the respective memory units) at memory controller 190 is delayed by different amounts from different DRAMs. The extent of delay (even between successive ones of the DRAMs) can vary due to various factors such as propagation time for the control/address signals to be received at each of the DRAMs, the delays caused by bond pads, etc., when sending the DQ/DQS signals, etc. That is, the time durations 281-282 and 282-283 (not shown) may not be equal. The delays between other successive signals also may similarly be unequal (due to various capacitances, differing trace lengths between successive memory units, etc.).

In an embodiment, it is necessary for the memory controller to calibrate the delays encountered in reception of data so that the internal circuitry can be prepared ahead to quickly capture the data immediately after indication of availability by the DQS signal. Such a requirement may become increasingly important as the speed of the memories is further enhanced (due to the availability of a correspondingly shorter window to capture the data). For example, DDR3 technology supports clock speeds up to 800 Mhz and this may leave as little as 625 pico seconds window time for a valid data capture.

If the compensation delay for each memory unit 120A-120H is not determined accurately, there may be the risk of including the wrong byte in a word. For example, byte 298 (which should be present in the first word of a cache line) may be included in the second word along with each byte following 291-297. Alternatively, a substantial error (compared to a correct/calibrated value) in the compensation delay can also cause the memory controller to sample the DQ line at the wrong time point and thus read a wrong value for an expected byte.

Thus, with respect to FIG. 2, it may be necessary for memory controller 190 to determine the specific time instances 281-288 at which the DQS signal is likely to be asserted so that each byte can be sampled at the appropriate time instance and then included in the correct word. The specific time instances may be represented as a corresponding delay (or the accurate value to be used for compensation delay) in relation to the time instance at which the read request is issued on path 191. Such a determination is referred to as read leveling in the subject illustrative embodiments.

An aspect of the present invention provides for reliable performance of read leveling operation. The features can be appreciated based on comparison with a prior approach and accordingly the prior approach is described briefly below.

4. Prior Approach for Read Leveling

Figure 3:
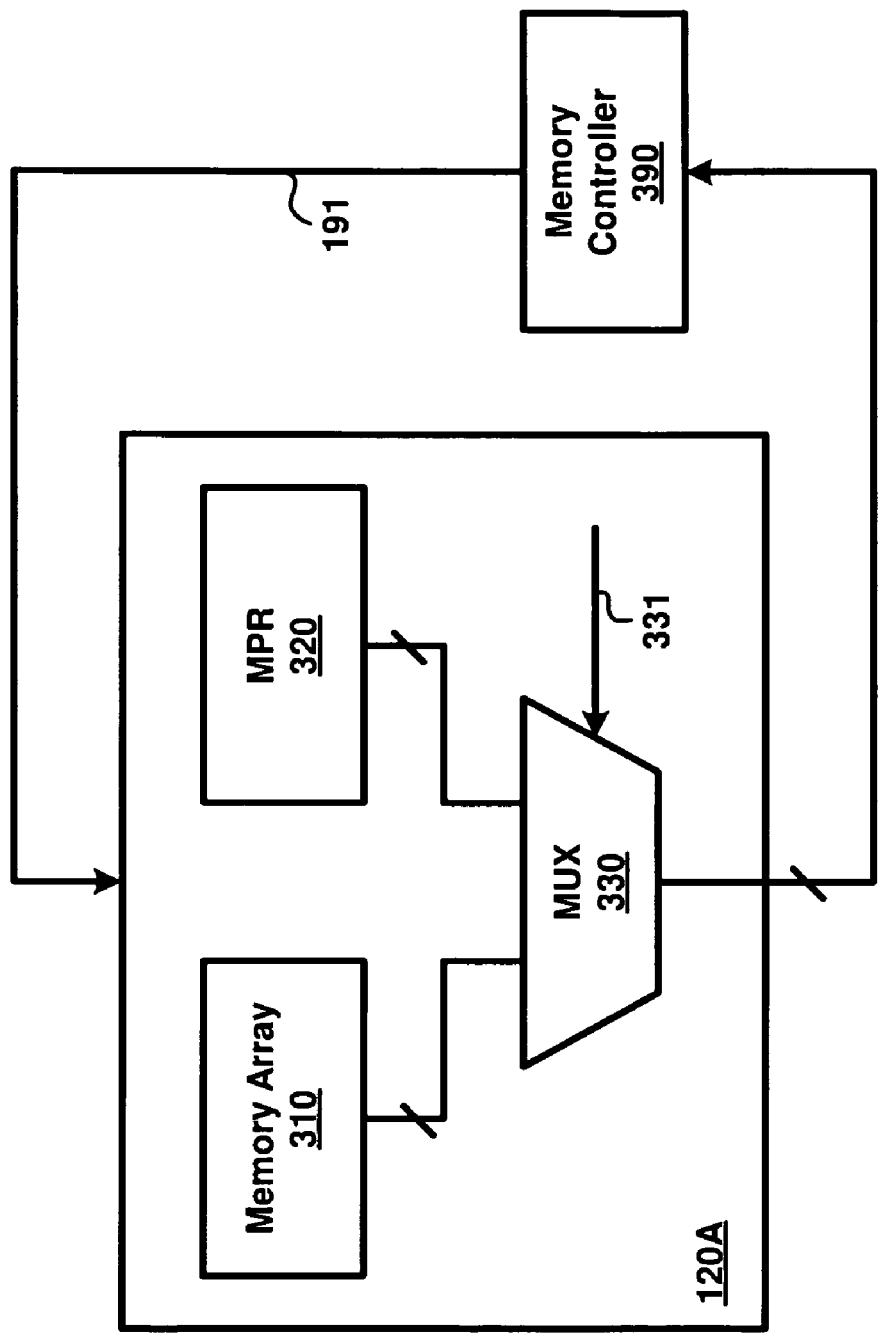
FIG. 3 is a block diagram illustrating the manner in which read leveling is performed in a prior embodiment.

FIG. 3 is a block diagram illustrating the manner in which read leveling is performed according to a prior approach. DRAM 120A is shown containing memory array 310, multipurpose registers (MPR) 320, and multiplexer (Mux) 330.

To perform read leveling, memory controller 390 issues a corresponding (start read leveling) command on path 191. In response, control line 331 is set to cause mux 330 to select a value from MPR 320. When read leveling is not being performed, control line 331 may be set to cause mux 330 to select the value received from memory array 310. The memory array may correspond to a SDRAM widely available in the market place.

It may be appreciated that MPR 320 is programmed by a vendor of the DRAM manufacturer to a specific value and controller 390/190 may not have the ability to (over) write other values. According to the DDR3 specification, the specific value equals alternate hex values of 00 and FFs in the memory units. Thus, on a single DQ (from a corresponding memory unit, successive values of 00,FF,00,FF,00,FF,00,FF may be received in four clock cycles.

Thus, memory controller 390 may issue a read command and then perform several capture operations with different delay values for each DRAM, until the expected specific value is received for that DRAM.

The approach of above may have several limitations. For example, the single pattern forced by the approach of above may be susceptible to certain types of cross talks and board level noises. Furthermore, in an embodiment, the pair of bytes received from the DIMM in a single clock cycle (i.e., rising and falling edges) may be assembled and sent on a 16-bit path for further processing. As a result, each of such pairs may contain 00FF values, which may prevent detection of stuck at faults (e.g., if any of the bits in the first 8 positions are stuck at 0) in the path of any individual bit.

Such problems may present challenges in determining the calibrated delay values associated with read leveling, noted above.

Several aspects of the present invention overcome at least such disadvantages as described below in further detail.

5. Reliable Read Leveling

Figure 4:
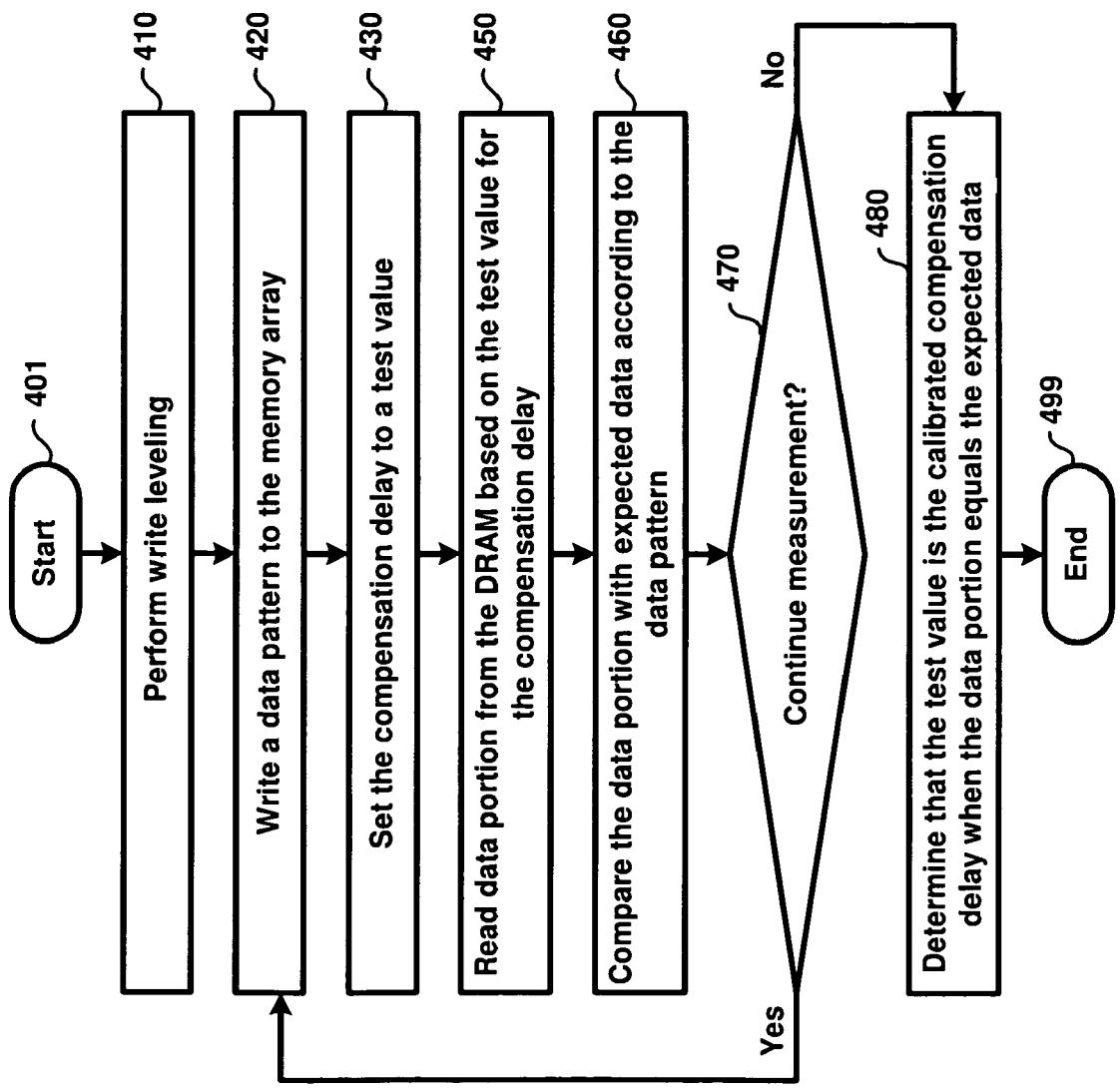
FIG. 4 is a flow chart illustrating the manner in which read leveling is performed in an embodiment of the present invention.

FIG. 4 is a flowchart illustrating the manner in which each of the DRAMs may be calibrated reliably for read leveling according to an aspect of the present invention. The flowchart is described with respect to FIG. 1 (and in reference to DRAM 120A) merely for illustration. However, various features can be implemented in other environments (and other DRAMs) also without departing from the scope and spirit of various aspects of the present invention, as will be apparent to one skilled in the relevant arts by reading the disclosure provided herein.

In addition, some of the steps may be performed in a different sequence than that depicted below, as suited in the specific environment, as will be apparent to one skilled in the relevant arts. Many of such implementations are contemplated to be covered by several aspects of the present invention. The flow chart begins in step 401, in which control immediately passes to step 410.

In step 410, memory controller 190 performs write leveling of DRAM 120A. Write leveling entails determining the various delays that may be required to reliably write (store) data into DRAM 120A. Write leveling can be performed using one of several known approaches and it is sufficient to appreciate that any desired data can be reliably written into DRAM 120A once the write leveling is performed.

In step 420, memory controller 190 writes a data pattern to memory array 310 of DRAM 120A. The data pattern may contain multiple bytes, each written into a different memory location. Different values may also be chosen for different bytes. The values may be chosen to be able to identify different problem scenarios (stuck at faults, board level noise, cross talks, etc., noted above) based on different retrieved values, as described below.

In step 430, memory controller 190 sets the compensation delay to a test value. The test value can be a different value in each iteration of the loop of steps 430-470. The test values may be chosen to 'search' for the optimum value. In addition, any available information (e.g., parameters determined while write leveling of above) can be used in choosing the test value for different iterations.

In step 450, memory controller 190 reads a data portion from DRAM 120A based on the search value set for the compensation delay in step 430. The data portion may correspond to a single byte of the stored data pattern. The data portion may be read by issuing a read command on path 191 with the address at which the byte has been previously stored in step 420.

In step 460, memory controller 190 compares the (read) data portion with expected data according to the data pattern. When there is a match, it may be concluded that the test value set in the present iteration is acceptable for later read operation during normal read operation.

In step 470, memory controller 190 may decide whether to continue calibration. In general, when the search is complete according to a pre-specified approach, the calibration may be ended. Control passes to step 430 if the calibration is to be continued and to step 480 otherwise.

In step 480, memory controller 190 may determine that the test value is the calibrated delay in an iteration in which the data portion equals the expected data. It should be appreciated that such equality may be encountered in several iterations, and the test value of one of the iterations maybe chosen balancing for various tolerances and providing as much time as possible for any subsequent processing after capturing the data portion. The flowchart ends in step 499.

It should be appreciated that the pattern of step 420 can be chosen by a designer of memory controller or possibly provided by a user of a system in which the memory system of FIG. 1 is deployed. Irrespective, the specific data portions may be written after the memory system is powered on.

In one embodiment, the data pattern written to each of the memory units equals 55, AA, CC, 33, 66, 99, 11, and 22 in hexa decimal notation. However, different data patterns may be used for different memory units. In addition, the iterations of above can be performed by storing new/different patterns, which may be less susceptible to certain types of potential issues. As a result, a designer of memory controller 190 may use different sets of patterns as suited for addressing the corresponding known problems.

Furthermore, the above noted pattern would ensure that both 0 and 1 would be present at respective clock cycles in each of the bit paths when the two bytes received on the two edges of a clock period are transferred/processed on 16-bit signals/paths. As an illustration, the first group (received in one DQS cycle) is 55AA and the next group is CC33 and there are bit value changes in the last two bits corresponding to 5 (0101) and C (1100). Having such different values, which provide different binary values in the same bit position, help detect internal stuck-at faults.

In addition, the test delay of step 430 may be set with additional information since each byte of the pattern uniquely represent a particular position (e.g., CC is in the third position). Various approaches can be used in estimating the correct delay based on the actual byte received. For example, if the expected byte is 66 and 33 is received, the delay adjustment is less than if AA is received in the above example.

Once the read leveling is performed (of all the DRAMs), the data may be retrieved reliably from each of the DRAMs (memory arrays).

The features described above can be employed in various embodiments of the memory controller. The description is continued with respect to the details of an example memory controller.

6. Memory Controller

Figure 5:
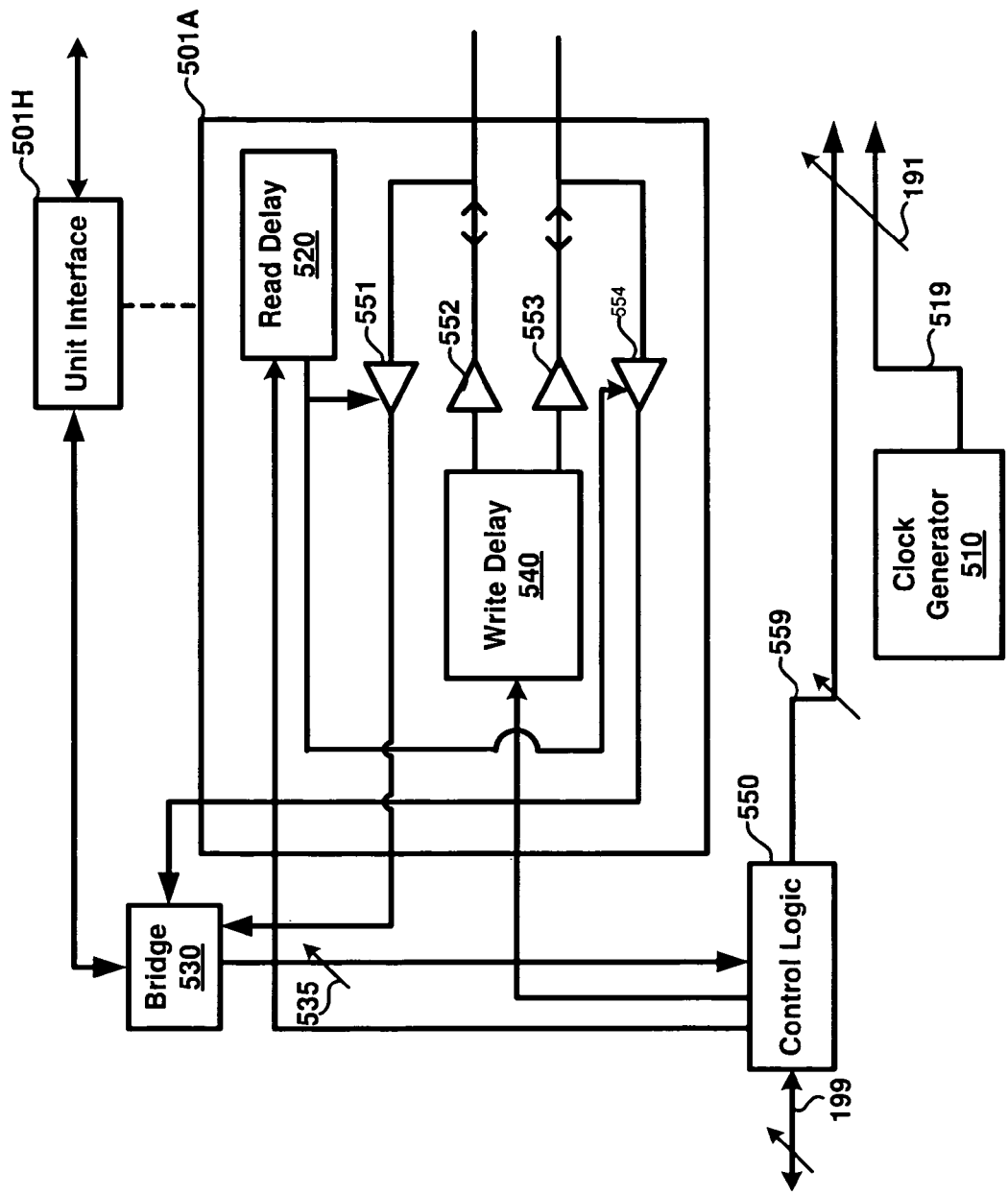
FIG. 5 is a block diagram illustrating the details of a memory controller in an embodiment of the present invention.

FIG. 5 is a block diagram illustrating the details of a memory controller in an embodiment of the present invention. Only the details as relevant to the access operation are shown for conciseness. Memory controller 190 is shown containing clock generator 510, bridge 530, unit interfaces 501A-501H, and control logic 550. Unit interface 501A is in turn shown containing read delay 520, write delay 540, and buffers 551-554. For conciseness, only the details of one unit interface is shown, though the remaining unit interfaces can be implemented similarly. Each of the blocks is described below in further detail.

Bridge 530 may construct respective words of cache lines, with each word containing the respective bytes received from the unit interfaces 501A-501H. As the bytes are received with skewed delay (fly by delays), bridge 530 may send the collated words after the byte from the last memory unit 120H is received.

Control logic 550 performs the operations described with respect to FIG. 4 above and determines accurate value for the compensation delay of each of the memory units, as noted there. The delay parameters determined with respect to write leveling may be stored in write delay 540, and those related to read leveling may be stored in read delay 520. The determination and storing may be performed once the memory controller is turned on (powered on), and potentially be used until the memory controller is turned off or reset again.

In addition, after the leveling operations, control logic 550 receives read and write commands on path 199, and issues corresponding requests on path 191. With respect to read operations, control logic 550 receives each word of a cache line from bridge 530 and provides the same on path 199 as a response to an earlier received read command. Upon a successful requested write, a confirmation may also be provided on path 199.

Path 199 may be connected to a processor (e.g., a central processing unit, not shown), which issue the read and write commands based on execution of various software instructions. The software instructions may implement user applications (e.g., data processing, graphics processing, etc.).

Clock generator 510 provides clock signal 519 for operation of each of the DRAMs 120A-120H. Signals 201-208 correspond to the same signal with time skew, when received at the respective DRAMs. Though the connections are not shown, clock generator 510 may provide other clock signals (some divided) for the operation of other internal components of memory controller.

Write delay 540 delays the writing of data and assertion of the DQS signal by a magnitude specified by the control logic. The data (byte) to be written is received from control logic 550. Buffers 552 and 553 respectively are used to provide the write DQS and the data DQ respectively. Each of these buffers is tri-stated when the write operation is not being performed, to isolate the signals on the shared bus.

Read delay 520 controls the durations in which input buffers 551/554 can receive and pass the DQ/DQS signals. By blocking the DQ/DQS signal during non-read durations, read delay 520 ensures that the inbound logic inside "bridge" is isolated from any noise (including the assertion of write DQS) that may be received on DQS path during the non-read duration. Thus, the delay parameter (calibrated compensation delay) determined by read leveling is used to anticipate the approximate time instance at which the DQS read may be received and buffers 551 and 554 may be controlled to receive the DQS strobe and DQ data respectively.

It may be appreciated that control logic 550 may be designed to use either the prior approach described with respect to FIG. 3 or that described with respect to FIG. 4 to perform the read leveling, as described above. In other words, the combination of both the approaches may be supported to provide backward compatibility with the prior art approach described above and also the inventive approach described above.

Thus, once the calibration delay is determined as described above, memory controller 190 may accurately receive the bytes (data portions) sent by the respective DRAMs. In addition, as the bytes may potentially be available quickly soon after being sent by the memory units, each word can be formed from the correct set of corresponding bytes from different memory units.

7. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of performing read leveling of a memory unit, said method comprising:
    writing a data pattern to a memory array;
    setting a compensation delay to a test value;
    reading data from said memory array based on said test value; and
    determining whether said test value is an accurately calibrated compensation delay for said memory unit.

2. The method of claim 1, wherein said compensation delay is set to each of a plurality of values, and wherein said setting, said reading, and said determining are performed with respect to each of said plurality of values.

3. The method of claim 1 further comprising:
    performing a write leveling operation to determine a write delay associated with a write operation to said memory unit, wherein said write leveling operation is performed prior to said writing said data pattern.

4. The method of claim 1, wherein said memory unit is a DRAM according to DDR3 technology.

5. The method of claim 1, wherein said data pattern comprises a sequence of bytes, wherein a first pair of successive bytes of said data pattern has a different value from a second pair of successive bytes.

6. The method of claim 1, wherein said data pattern comprises sequence of bytes that are different from one another.

7. A memory system comprising:
    a plurality of memory units coupled in a sequential chained topology to a chain path, wherein said plurality of memory units comprises memory arrays; and
    a memory controller operable to write data and further operable to read data from said plurality of memory units, said memory controller operable to:
    write a data pattern to a memory array of a first memory unit;
    set a compensation delay to a test value;
    read data from said memory array of said first memory unit based on said test value;
    determine whether said test value is an accurately calibrated delay for said first memory unit.

8. The memory system of claim 7, wherein said memory controller is further operable to send a read request to said plurality of memory units on said chain path, and in response to determining that said test value is said accurately calibrated delay for said memory unit said memory controller operable to receive data from said first memory unit based on said accurately calibrated delay.

9. The memory system of claim 7, wherein said memory controller comprises a control logic that subsequent to determining accurately calibrated delays associated with each memory unit is operable to receive a read command from a processor and further operable to send a read request in response thereto, said control logic further operable to receive data from each of said plurality of memory units based on accurately calibrated delay associated therewith and further operable to form a word based thereon and further operable to send said word to said processor.

10. The memory system of claim 7, wherein said control logic sets said compensation delay to each of a plurality of values, and wherein control logic is operable to perform said set, said read, and said determine based on each of said plurality of values.

11. The memory system of claim 7, wherein said control logic is operable to perform a write leveling operation to determine a write delay associated with a write operation to said first memory unit, wherein said write leveling operation is performed prior to said write of said data pattern.

12. The memory system of claim 7, wherein each of said plurality of memory units is implemented as a DRAM according to DDR3 technology, and wherein said accurately calibrated delay is determined for each of said plurality of memory units by treating each memory unit as said first memory unit.

13. The memory system of claim 7, wherein said memory controller comprises a unit interface associated with said first memory unit, said unit interface comprises:
a buffer operable to interface with said first memory unit; and
a read delay operable to block said buffer from receiving signals from said first memory unit during non-read operations, wherein said read delay is operable to receive a value representing said compensation delay and is further operable to control a duration in which said buffer receives signals from said first memory unit.

14. The memory system of claim 7, wherein said first memory unit further comprises:
a register operable to store a pre-specified value;
a multiplexor operable to output said pre-specified value in a calibration mode and further operable to output a value from said memory array otherwise,
wherein said memory controller is operable to send a request on said chain path to place said first memory unit in said calibration mode and is further operable to read said pre-specified value.

15. The memory system of claim 7, wherein said data pattern comprises a sequence of bytes, wherein a first pair of successive bytes of said data pattern has a different value from a second pair of successive bytes.

16. The memory system of claim 7, wherein said data pattern comprises sequence of bytes that are different from one another.

17. A memory controller for performing read leveling of a memory unit contained in a memory system, said memory controller comprising:
means for writing a data pattern to a memory array;
means for setting a compensation delay to a test value;
means for reading data from said memory array based on said test value; and
means for determining whether said test value is an accurately calibrated delay for said memory unit.

18. The memory controller of claim 17, wherein said compensation delay is set to each of a plurality of values, and wherein said means for setting, said means for reading, and said means for determining are performed with respect to each of said plurality of values.

19. The memory controller of claim 17, further comprising:
means for performing a write leveling operation to determine a write delay associated with a write operation to said memory unit, wherein said write leveling operation is performed prior to said writing said data pattern.

20. The memory controller of claim 17, wherein said data pattern comprises 55, AA, CC, 33, 66, 99, 11, and 22 in hexa decimal notation.

21. The method of claim 1 further comprising:
comparing said data from said memory array with an expected data according to said data pattern.

22. The method of claim 21, wherein said test value is accurately calibrated compensation delay for said memory unit if said data from said memory array is equal to said expected data.

23. The memory system of claim 7, wherein said memory controller is further operable to compare said data from said memory array of said first memory unit with an expected data according to said data pattern.

24. The memory system of claim 23, wherein said test value is accurately calibrated delay for said first memory unit if said data from said memory array is equal to said expected data.

25. The memory controller of claim 17 further comprising:
means for comparing said data from said memory array with an expected data according to said data pattern.

26. The memory controller of claim 25, wherein said test value is an accurately calibrated delay for said memory unit if said data from said memory array is equal to said expected data.

* * * * *